United States Patent [19]
Smith et al.

[11] Patent Number: 5,583,874
[45] Date of Patent: Dec. 10, 1996

[54] 10BASE-T PORTABLE LINK TESTER

[75] Inventors: Michael E. Smith, N. Plainfield, N.J.; Jose J. Picazo, Jr., San Jose, Calif.

[73] Assignee: Infonet Computer Systems, Inc.

[21] Appl. No.: 350,899

[22] Filed: Dec. 7, 1994

[51] Int. Cl.⁶ .................................................. G06F 11/00
[52] U.S. Cl. ........................................ 371/20.1; 370/245
[58] Field of Search .................................. 371/20.1, 22.6, 371/29.1, 29.5, 11.2, 8.2; 395/185.01, 185.09, 185.02, 183.19, 183.20, 182.02; 379/29, 1; 375/10, 224; 370/13, 14, 60, 60.1

[56] References Cited

U.S. PATENT DOCUMENTS

| | | | |
|---|---|---|---|
| 4,493,951 | 1/1985 | Sanderson et al. | 179/175.3 F |
| 5,057,783 | 10/1991 | Gubisch | 324/710 |
| 5,208,803 | 5/1993 | Conforti et al. | 370/13 |
| 5,375,126 | 12/1994 | Wallace | 371/20.1 |
| 5,414,708 | 5/1995 | Webber et al. | 370/85.3 |
| 5,438,528 | 8/1995 | Emerson et al. | 364/580 |

*Primary Examiner*—Robert W. Beausoliel, Jr.
*Assistant Examiner*—Phung My Chung
*Attorney, Agent, or Firm*—Ron Fish; Falk, Vestal & Fish

[57] ABSTRACT

A portable tester for local area networks comprising a AUI circuit coupled to a media specific transceiver, a battery, a push-to-test switch and four light emitting diodes and an RJ45 jack for each of a personal computer and a network hub. When the push-to-test switch is pushed, power is applied to the media access unit and a link pulse is generated for coupling via a PC jack to a personal computer plugged into that jack. The link pulse is also coupled to any network hub plugged into a hub jack. The PC and network hub cannot both be simultaneously connected. If whichever unit is connected receives the link pulse and generates its own link pulse which is received by the tester, a link status LED is lit green. Otherwise, it is left dark. If the unit connected outputs a data packet in response to receipt of the link pulse, a receive data LED is lit green. Otherwise, it is left dark. If the link pulse is positive-going on the correct line, a polarity LED is lit green. Otherwise, it is left dark.

4 Claims, 3 Drawing Sheets

10BASE-T PORTABLE LINK TESTER

BACKGROUND OF THE INVENTION

Field of the Invention

The invention pertains to the field of testing 10Base-T network links for problems, and, more particularly, to a portable testing device to test 10Base-T local area network links both from the wall to the computer and from the wall to the hub.

The problem with modern local area network installations tying one or more personal computers together with other devices via a hub and 10Base-T network links from the hub to the devices is in effective and cost efficient trouble shooting. When a problem occurs with a user's computer on a network, the user does not know whether the problem is with the computer, the hub or the connection of the computer to the hub via the local area network connection. Frequently, the user will wish to call a service representative to solve the problem. The difficulty is that the user does not know whether to call the service representatives for the computer or the hub or the company who installed the local area network wiring. Frequently, the service organizations have minimum charges which they charge for making the trip to the customer site even if there is nothing wrong with the particular item they were called to service when they get there. Thus, if the user thinks his or her personal computer is the problem but the problem is actually in the connection between the PC and the network outlet pod in the wall, the user will call a service technician for the PC only to find out that there is nothing wrong with the PC. The personal computer service technician will direct the user to contact the network hub manufacturer. The service technician for the network hub will then make the trip and tell the user to call the service technician for the network cabling. The user will therefore have to pay two minimum service charges before even getting the correct technician on the scene to solve the problem. The user will then also have to pay the service technician who actually solved the problem for whatever charges were incurred. Frequently, these minimum charges that the user will have to pay for service calls made on system components that were not defective are as high as $250 per visit. If the user is wrong as to where the problem lies, a substantial amount of money can be wasted before the problem is fixed.

Thus, a need has arisen for a simple network link tester which a user can use to determine if the problem is with his or her computer or the wiring/hub.

SUMMARY OF THE INVENTION

The teachings of the invention contemplate a portable battery operated LAN link tester device which the user can use to determine if a network problem is with his personal computer network interface or with the wiring/hub or both. The link tester comprises a battery coupled through a push-to-test switch to a combination AUI/transceiver circuit for 10Base-T media. The AUI/transceiver circuit is coupled to two RJ45 jacks, one labelled "PC" and the other labeled "Hub". The AUI/transceiver combination serve to generate a link pulse every 100 milliseconds and send it via the PC jack to any personal computer network interface connected to the PC jack or via the hub jack to any hub connected to the hub jack. This process of generating simulated link pulses causes any PC connected to the PC jack to think it is connected to a hub and to send data packets intended for the hub to the link tester. Likewise any hub connected to the link tester thinks it is connected to a PC and transmits data packets intended for the PC to the link tester. Likewise, any PC connected to the tester generates its own link pulses to inform the hub of its existence on the network and transmits the link pulses to the link tester, and any hub connected to the tester generates its own link pulses to inform the PC of its existence on the network and transmits the link pulses to the link tester. The AUI/transceiver combination is connected to four LED's serving as the feedback portion of the user interface. One LED indicates when power is applied to the AUI by virtue of the push-to-test switch having been pushed by glowing green. Another LED indicates when data packets are being received by the link tester from whatever device is connected to PC or hub jacks by glowing green. Another LED indicates the viability of the link connection by glowing green whenever link pulses are being received from whatever device is connected to the PC or Hub jacks. Finally, a fourth LED glows green whenever the polarity is correct of the receive data lines of the cable connecting the device under test to either the PC or hub jacks. This is assumed by the link tester whenever a positive-going link pulse is received on the positive polarity receive line and a negative-going link pulse is received on the negative polarity receive line. If any one of these conditions is not met, the corresponding LED does not glow green, although if the power LED is not green, none of the other LED's will be green either.

In other embodiments where other medias or protocols are used, different transceivers and different circuits other than an AUI to implement different protocols such as different link pulse test signal generation or different link verification protocols such as the generation of other signals different from link pulses may be employed with a user interface which verifies when power is employed, when link verification protocol is satisfied, when data packets are being received and when cable connections are correct.

DETAILED DESCRIPTION OF THE PREFERRED EMBODIMENT

Figure 1:
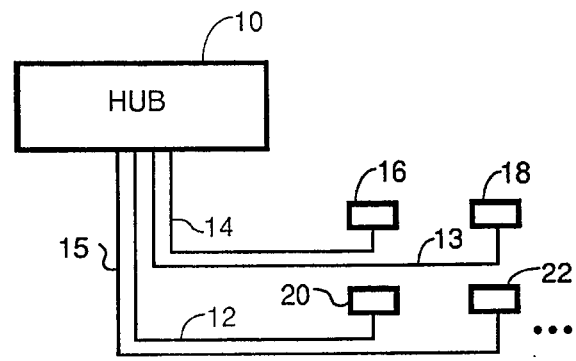
FIG. 1 is a block diagram of a typical local area network installation comprising the environment in which the invention finds utility.

Referring to FIG. 1, there is shown typical local area network configuration. A hub 10 is connected to each of two local area network links 12, 13, 14 and 15. Each link is a 10Base-T twisted pair in the preferred embodiment, but in alternative embodiments, the network segments can be fiber-optic waveguide (10Base-F or FOIRL), fast Ethernet (100 Megabit/sec), full duplex 10Base-T Ethernet (20 Megabits/sec), isoEthernet, switched Ethernet or ATM without departing from the teachings of the invention. Each network link is coupled to a single personal computers and other devices such as printers etc., said devices being symbolized by boxes 16, 18, 20, and 22. Packets of data to be transmitted from one computer to another such as from a work station 16 to a server 20 for storage are output by the workstation 16 onto network segment 14 and enter hub 10. The hub has one or more repeater chips in it that receive the incoming packets and repeat them, i.e., re-transmits them on all other network links coupled to the hub so that they reach the other devices on the network. Only the device to which each individual packet is addressed actually uses the packet. Thus, the data placed on network link 14 by computer 16 is repeated on network links 13, 12 and 15, but since it is addressed only to server 20, only server 20 actually uses the data packets.

Figure 2:
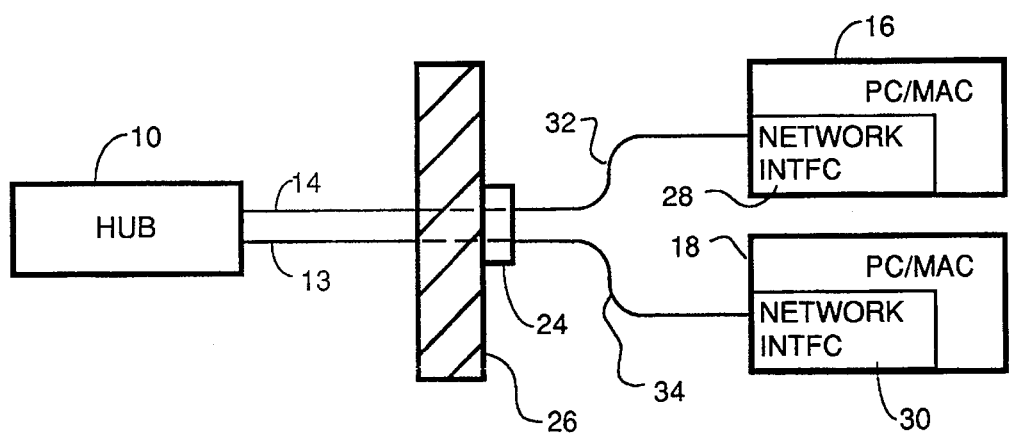
FIG. 2 is a diagram of a typical wall-to-PC connection.

FIG. 2 represents a schematic close-up view of the connection through a wall of the hub 10 to the computers 16 and 18 in the local area network. Typically, the hub is in a wiring closet and is connected to the individual network links through a punch-down block or other wiring termination device. Those details have been omitted as they are irrelevant to the invention. The hub is connected to the computer 16 through a twisted pair link 14 and a wall connector 24 mounted to wall 26. The hub is connected to the computer 18 through a twisted pair link 13 and a wall connector mounted to wall 26. The wall connector has two modular RJ-45 connectors therein (much like the RJ-11 connectors into which U.S. Citizens plug their telephones). Each of these modular connectors has a cable plugged into it that connects the link 14 to the network interface cards 28 and 30 of PC's 16 and 18. Of course, other peripherals such as printers etc. Also have network interface cards, and the teachings of the invention are equally applicable to testing links between such other peripherals and hubs. The network interface cards receive and transmit packets over link 14 via the cables 32 and 34. Each of cables 32 and 34 have 4 wires therein comprising two twisted pairs. One twisted pair carries differential transmit signals and the other twisted pair carries differential receive signals.

When a user experiences a network problem, it will not usually be clear to the user whether the problem is in their network interface card such as cards 28 and 30, the cables 32 and 34, the link 14, or the hub 10. Accordingly, the user will not know which service technician to call.

Figure 3:
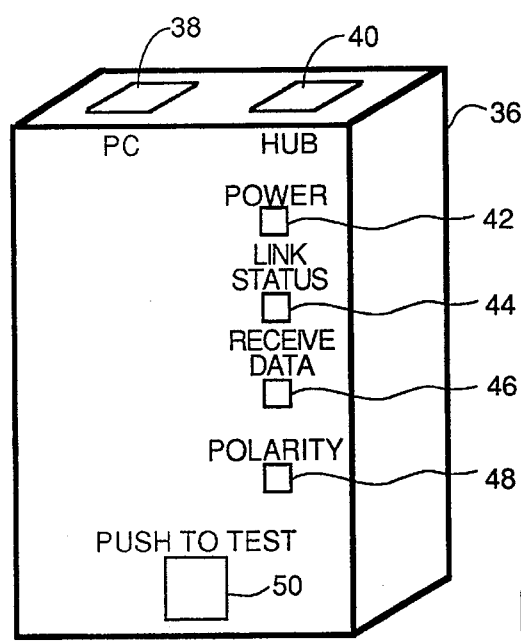
FIG. 3 is a perspective view of the portable network link tester according to the teachings of the invention.

The portable link tester device shown in FIG. 3 substantially aids the process of isolating the general area where the problem has arisen. The device comprises a housing 36 in which are mounted two modular RJ-45 jacks 38 and 40, labelled PC and HUB, respectively. On the front panel of the tester, four light emitting diodes 42, 44, 46 and 48 are used as part of the user interface. A push to test switch 50 allows the user to temporarily connect an internal 9 volt battery (not shown) to the internal circuitry connected to the jacks 38 and 40 and the LED's.

The way in which the tester is used is as follows. With reference to FIGS. 2 and 3, when the user wishes to test the status of the hub 10, the user plugs a cable from the hub such as cable 14 into the hub jack 40 of the tester and presses the push to test switch 50. If the hub is working and the cable has the proper polarity on the receive lines, the LED's 42, 44 and 48 will glow green continuously and the Receive Data LED 46 will glow green each time the hub receives a data packet from another link like link 14 and repeats it on all other links including link 14 connected to the tester. In other words, LED 46 will glow green only when the hub is transmitting a packet on the link coupled to the tester. When the user wishes to test the network interface card of the PC/Mac and the cable from the interface card to the wall, the user plugs the end of the cable such as cable 32 into the PC jack 38 and presses the push to test switch 50. If the interface card is working and the cable is working and connected with proper polarity on the receive lines, the LED's 42, 44 and 48 will glow green.

Figure 4:
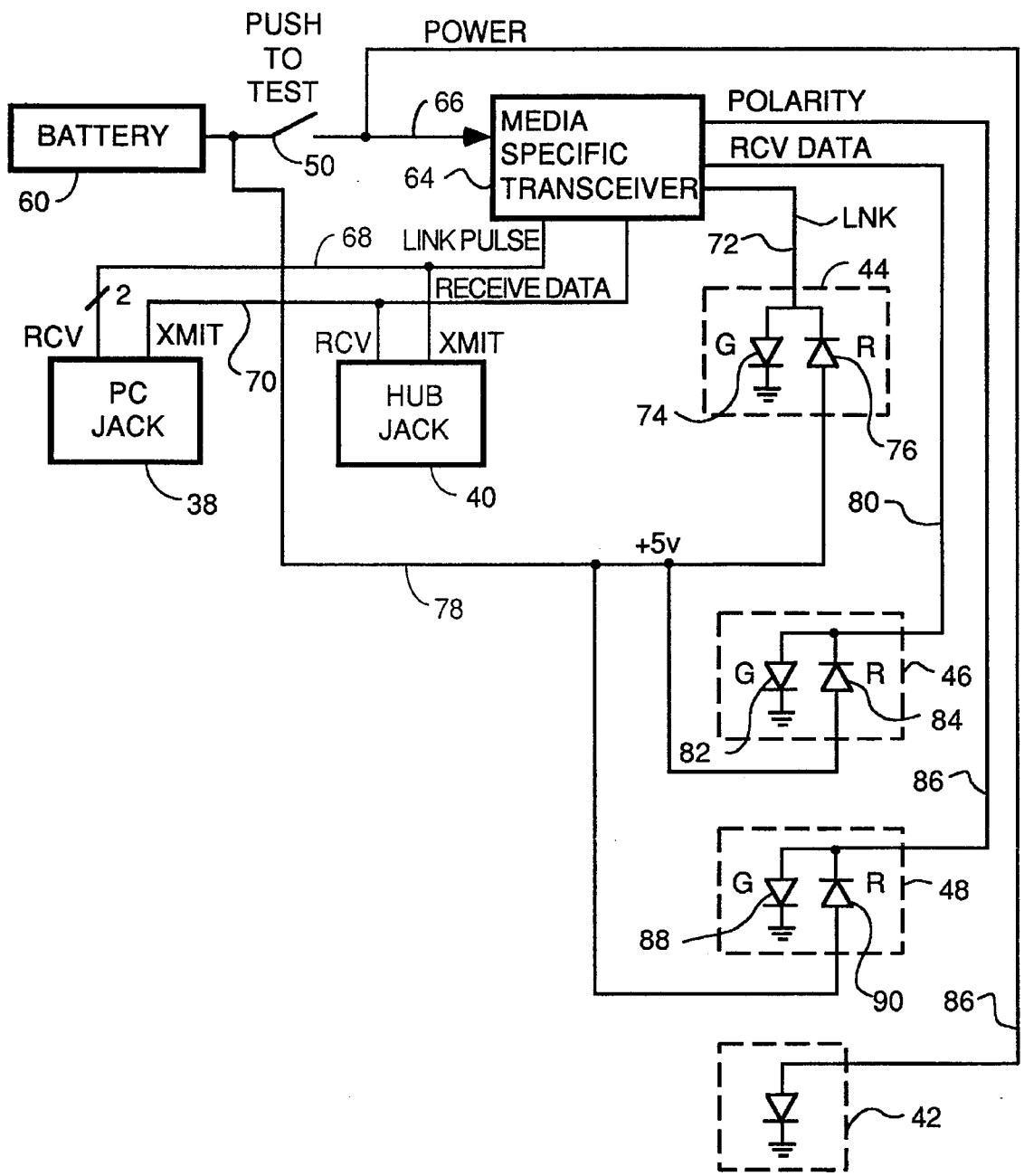
FIG. 4 is a block diagram of an embodiment of the invention.

FIG. 4 is a block diagram of an embodiment incorporating the broad teachings of the invention. A battery 60 is coupled to a media specific transceiver circuit 64 via Push to Test switch 50 and line 66.

The media specific transceiver 64 (hereafter transceiver) serves to generate the link pulses needed to convince any device connected to the PC or Hub jacks that it is connected to a valid network. The transceiver 64 circuit generates a link pulse every 100 milliseconds, and formats the link pulse properly for whatever media type is connected to the tester. In the case of a twisted pair 10Base-T network, the link pulse is converted into a pair of differential signals which are output on bus 68. Bus 68 is comprised of two conductors, each of which carries one of the differential signals making up the link pulse. These two conductors are connected to the receive pins of the PC jack (nomenclature of "receive" and "transmit" as those terms are used herein are relative to the PC) and to the transmit pins of the hub jack 40. Therefore, the PC anticipates receiving the link pulse on its receive pins, but the hub anticipates receiving the link pulse on its transmit pins as it is these conductors on which the PC network interface card normally outputs its link pulse for transmission to the hub.

When the PC receives link pulses from the tester via bus 68, it thinks it is coupled to a hub and outputs any data packets to be transmitted to the hub on its transmit pins. These conductors are coupled via PC Jack 38 to bus 70 coupled to the transceiver 64. Likewise, when the hub receives link pulses, it outputs any data packets to be sent to PCs connected to it on its receive pins. These conductors are normally connected to the receive pins of the PC, but when the hub is disconnected from the link cable running to the PCs and plugged into the hub jack 40, the receive pins of the hub are then connected to bus 70 and transceiver 64 within the tester. Therefore, any data packets transmitted by the hub are transmitted to the transceiver 64 via bus 70.

Both the PC and the hub also generate and output link pulses every 100 milliseconds in the 10Base-T specification. The PC outputs its link pulses on the transmit lines and they are received via PC jack 38 and bus 70. The hub outputs its link pulses on the receive pins of hub jack 40 and these pulses are received by the transceiver 64 via bus 70.

The transceiver 64 is also coupled to the four dual red-green light emitting diodes (hereafter dual LED's) 44, 46, 48 and 42 of the user interface. When the tester is connected to a PC, and transceiver 64 receives a link pulse from the PC via bus 70, it outputs a +5 volt signal on line 72 which causes the green LED 74 within dual LED 44 to light. If no link pulse is received, the transceiver 64 grounds line 72. Because, the anode of the red LED 76 within dual LED 44 is connected to the battery via line 78 and its cathode is coupled to line 72, the red LED will glow if no link pulse is received.

A similar result occurs if the tester is coupled to a hub via Hub jack 40, and a link pulse is received from the hub via the receive pins and the bus 70. This will cause the transceiver 64 to output +5 volts on line 72. If no link pulse is received, transceiver 64 will keep line 72 grounded. Lighting of the green LED 74 within link status dual LED 44 indicates that the transmit pair coupling the PC interface card to the tester are good and the PC interface card is good insofar as it is able to generate the link pulse.

The tester will do similar operations to light the receive data dual LED 46. Assuming the tester is coupled to a PC via the PC jack 38, the tester generates a link pulse on bus 68 when the push to test switch 50 is closed. This link pulse is transmitted to the PC via the bus 68 and the receive pair in the cable connecting the PC to the tester. This causes the PC to think it is connected to a hub. The PC will then output one or more data packets to the hub on the transmit pair coupled to bus 70. These data packets, when received by transceiver 64 will cause the transceiver to output +5 volts on line 80. This causes green LED 82 within receive data dual LED 46 to glow. If not data packet is received in response to the link pulse generated by the tester, the transceiver 64 will leave line 80 at ground potential thereby causing red LED 84 to glow by virtue of the connection of its anode to bus 78. A similar sequence occurs if the tester is connected to the hub. The tester generates a link pulse on bus 68 when the push to test switch is closed. This causes the hub to receive the link pulse via the receive pair of the cable connecting it to the tester and to output one or more data packets on the transmit pair of the cable. The packet is conveyed to the transceiver via bus 70 and causes it to output +5 volts on line 80 thereby lighting green LED 82. If no packet is received, line 80 is grounded, and red LED 84 lights.

Whenever push to test switch 50 is closed, green power LED 42 will light by virtue of connection of the anode thereof to the switched power via line 66.

When the transceiver 64 detects that the polarity of the receive pair of the Hub jack 40 or the transmit pair of the PC jack 38 is reversed, the transceiver grounds line 86 thereby causing red LED in dual polarity LED 48 to light. If the polarity is not reversed, transceiver 64 outputs +5 volts on line 86 thereby lighting green LED 88 in dual polarity LED 48 indicating correct polarity. Polarity can be checked by the circuitry in the tester because the tester expects to see a positive-going link pulse on one of the lines on which the device being tested transmits data and expects to see a negative-going pulse on the other line. If these conditions are found, the tester device lights the dual polarity LED green. If these conditions are not met, the tester device lights the dual polarity LED red.

Figure 5:
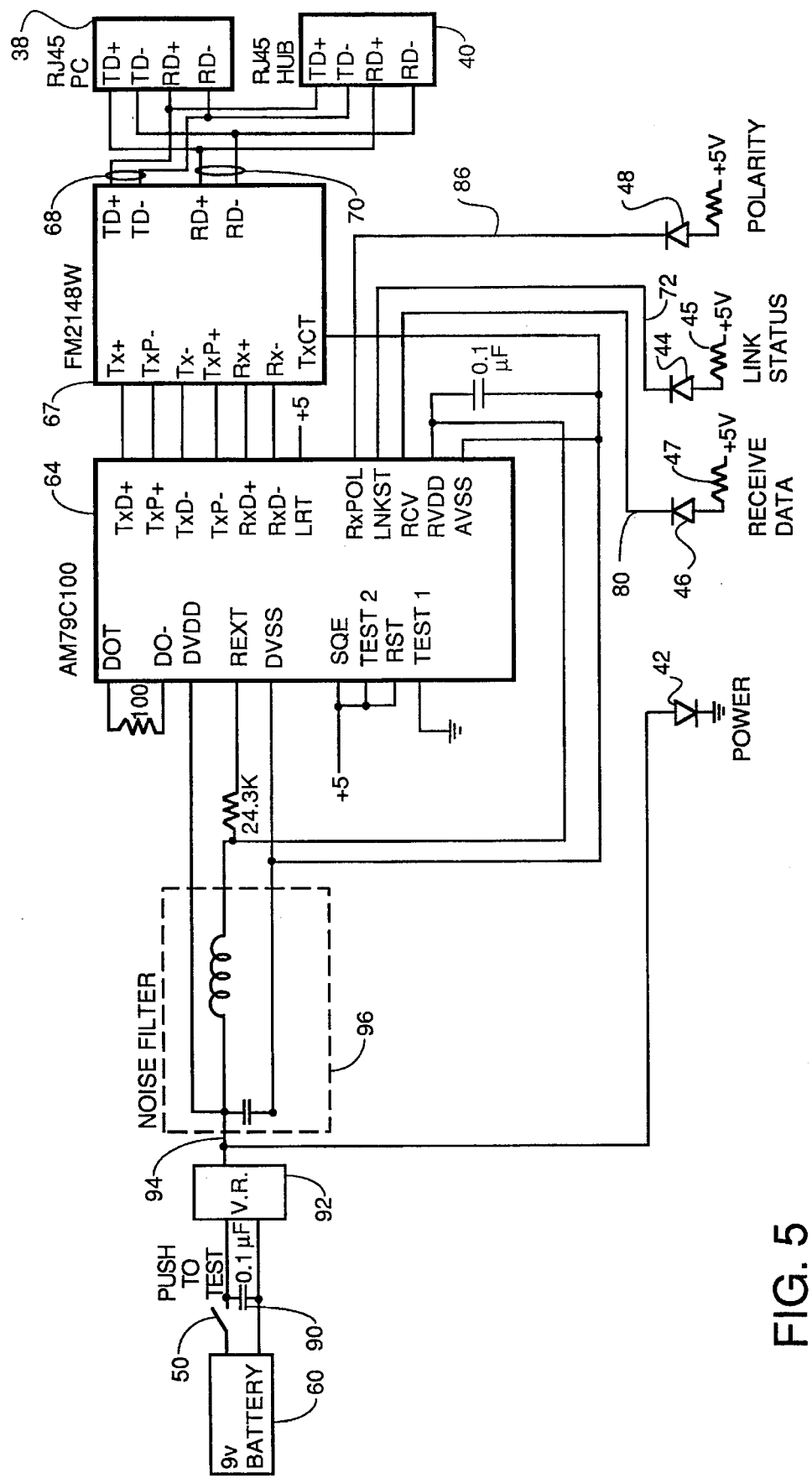
FIG. 5 is a schematic diagram of a portable network link tester according to the teachings of the invention.

Referring to FIG. 5, there is shown a detailed schematic diagram of a tester according to the preferred embodiment. The embodiment of FIG. 5 differs somewhat from the embodiment of FIG. 4 in that the LED's are lit green if the particular test condition associated with a particular LED indicate proper function, and not lit at all if the function associated with the particular LED is not correct. Elements that have the same reference numbers as elements in FIG. 4 serve the same function and interact with the other elements in the same way. Battery 60 is a 9 volt battery coupled to push to test switch 50. Capacitor 90 serves as a noise filter to shunt high frequency noise to ground if any is picked up on the battery lines. A step down voltage regulator 92 generates a regulated +5 volts on line 94. A noise filter 96 prevents any noise picked up on the power lines from reaching the transceiver chip 64. The +5 volt power and ground potentials are connected to the appropriate pins of an AMD AM79C100 transceiver chip 64 which generates the link pulses. The transceiver chip 64 generates the link pulses as component signals separated into two differential pairs on the TXD+, TXP+, TXD– and TXP– lines. These signals are filtered and summed by a filter chip 67. The sum of these signals is output as the link pulses on the TD+ and TD– lines as a differential pair. The TD+ and TD– lines comprise bus 68. Data packets received from the PC and hub are conveyed by bus 70 to the RD+ and RD– lines of filter chip 67. These signals are passed straight through the filter chip to the RXD+ and RXD– pins of the transceiver chip 64. The transceiver chip 64 senses link pulses received from the PC and hub and the polarity thereof, and senses received data packets and lights the appropriate ones of the LED's 44, 46 and 48 appropriately. Specifically, when a link status pulse is received from the PC or the hub (only one can be connected at any particular time), the link status LED 44 is lit green by virtue of transceiver chip 64 dropping the voltage on line 72 from +5 volts to ground potential. Since the anode of LED 44 is connected to +5 volts through 330 ohm resistor 45, and since line 72 is connected to the cathode of the LED 44, the LED will light. If the link status pulse is not received, the Link Status LED 44 is left dark by maintaining line 72 at +5 volts. Likewise, if a data packet is received from either the PC or the hub (only one can be connected at any particular time), the Receive Data LED 46 is lit green by driving line 80 from +5 volts to ground potential. Line 80 is connected to the cathode of LED 46, and the anode of the LED is connected to +5 volts through a 330 ohm resistor 47. If no data packet is received, the Receive Data LED 46 is left dark by leaving line 80 at +5 volts. Likewise, if the testing device sees a positive-going link pulse on the proper line on which the PC transmits data, it lights the Polarity LED 48 green by driving line 86 from +5 volts to ground potential in a similar manner to the manner described above for LED's 44 and 46, but leaves LED 48 dark if a negative-going pulse is seen on that line. Likewise, if the testing device sees a positive-going link pulse on the proper line on which the network hub transmits data, it lights the Polarity LED 48 green, but leaves it dark if a negative-going pulse is seen on that line.

Although the invention has been described in terms of the preferred and alternative embodiments described above, those skilled in the art will appreciate many modifications and extensions of the above described technology that implement the teachings of the invention. All such modifications and extensions are intended to be included within the scope of the claims appended hereto.

What is claimed is:

1. A portable local area network testing device, comprising:

a portable enclosure enclosing said testing device;

a first jack mounted on said portable enclosure for connecting a network hub to said testing device via a cable having transmit and receive pairs;

a second jack mounted on said portable enclosure for connecting a computing device to the testing device via a cable normally used to connect said computing device to said hub said cable having transmit and receive pairs;

a first display device mounted on said portable enclosure;

a second display device mounted on said portable enclosure;

a third display device mounted on said portable enclosure;

a fourth display device mounted on said portable enclosure;

a power supply mounted within said portable enclosure;

a switch mounted on said portable enclosure and coupled to said power supply and to said first display device, for selectively coupling said power supply to said first display device and to a switched power terminal, said first display device indicating when power from said power supply is available at said switched power terminal;

test means mounted within said portable enclosure coupled to said first and second jacks and to said first, second, third and fourth display devices and to said switched power terminal, for generating link pulses periodically and outputting said link pulses to each of said first and second jacks and any network hub coupled to said first jack and any computing device coupled to said second jack when said switch is moved to a state where said power supply is coupled to supply power to said test means, and for receiving link pulses from any network hub coupled to said first jack and for receiving link pulses generated by any computing device coupled to said second jack, and, if link pulses are received from said network hub, for driving said second display device to indicate link status as acceptable, and if link pulses are received from any said computing device coupled to said second jack, for driving said second display device to indicate link status as acceptable, and for receiving a data packet from any network hub coupled to said first jack in response to a link pulse generated by said testing device and transmitted to said network hub via said first jack, and, if a data packet is received from said network hub, for driving said third display device to indicate reception of a data packet, and for sensing correct or incorrect polarity of the transmit and receive pairs of conductors in any cable connecting a network hub to said first jack and, if polarity is correct, driving said fourth display device to indicate polarity is correct, and if polarity is incorrect, driving said fourth display device to indicate polarity is incorrect, and for sensing correct or incorrect polarity of the transmit and receive pairs of conductors in any cable connecting a computing device to said second jack, and, if polarity is correct, driving said fourth display device to indicate polarity is correct, and if polarity is incorrect, driving said fourth display device to indicate polarity is incorrect.

2. A network testing device, comprising:

a portable enclosure enclosing said testing device;

a first jack mounted on said portable enclosure for connecting a network hub to said testing device via a cable having transmit and receive pairs;

a second jack mounted on said portable enclosure for connecting a computing device to the testing device via a cable normally used to connect said computing device to said hub said cable having transmit and receive pairs;

a first display device mounted on said portable enclosure;

a second display device mounted on said portable enclosure;

a third display device mounted on said portable enclosure;

a fourth display device mounted on said portable enclosure;

a power supply mounted within said portable enclosure;

a power supply;

a switch mounted on said portable enclosure and coupled to said power supply and to said first display device, for selectively coupling said power supply to said first display device and to a switched power terminal, said first display device indicating when power from said power supply is available at said switched power terminal;

a media access unit mounted within said portable enclosure and coupled to receive link pulses from devices coupled to said first and second jacks, said media access unit including circuitry to drive said second display device to indicate acceptable link status when there is a network hub coupled to said first jack which is transmitting link pulses to said testing device, said media access unit including circuitry to drive said second display device to indicate acceptable link status when there is a computing device coupled to said second jack which is transmitting link pulses to said testing device, said media access unit including circuitry to receive data packets from a network hub connected to said first jack, and said media access unit including circuitry to drive said third display device to indicate data packet reception when data packets are received from said network hub, and said media access unit including circuitry to receive data packets from a a computing device coupled to said second jack, and said media access unit including circuitry to drive said third display device to indicate data packet reception when data packets are received from said computing device coupled to said second jack, and wherein any said network hub coupled to said first jack is coupled by a cable which includes at least two conductors on which said network hub transmits link pulses, said media access unit being coupled to conductors of said cable coupling said first jack to said network hub and on which said network hub transmits link pulses and wherein said media access unit is coupled to said fourth display device such that if a positive going link pulse is detected on a predetermined one of said conductors on which said network hub transmits link pulses, said fourth display device is driven by circuitry in said media access unit to indicate correct polarity, and wherein any said computing device coupled to said second jack is coupled by a cable which includes at least two conductors on which said computing device transmits link pulses, said media access unit being coupled to said conductors of said cable on which said computing device transmits link pulses and wherein said media access unit is coupled to said fourth display device such that if a positive going link pulse is detected on a predetermined one of said conductors on which said computing device transmits link pulses, said fourth display device is driven by circuitry in said media access unit so as to indicate correct polarity.

3. A method for testing network connections to network interface circuits of personal computers, workstations, and other peripherals, hereafter referred to as computing devices, comprising the steps of:

connecting the network interface circuit of a computing device to a portable testing device;

generating a link pulse in said portable testing device and coupling said link pulse to said network interface circuit of said computing device;

sensing whether said network interface circuit of said computing device generates a link pulse in response to said link pulse generated by said portable testing device;

if said network interface circuit of said computing device generates a link pulse in response to said link pulse generated by said portable testing device, driving a first display device to indicate acceptable link status;

sensing whether said link pulse transmitted by said network interface circuit of said computing device in response to said link pulse generated by said portable testing device has a predetermined polarity, and, if so, driving a second display device to indicate said predetermined polarity has been sensed for the connection between the portable testing device and said network interface circuit of said computing device; and sensing whether said network interface circuit of said computing device transmits a data packet in response to said link pulse generated by said portable testing device, and, if so, driving a third display device to indicate a data packet is being received.

4. A method for testing network connections to repeaters coupled to ports of network hubs, comprising the steps of:

connecting a repeater of a network hub to a portable testing device;

generating a link pulse in said portable testing device and coupling said link pulse to said repeater of said network hub;

sensing whether said repeater of said network hub generates a link pulse in response to said link pulse generated by said portable testing device;

if said repeater of said network hub generates and transmits to said portable testing device a link pulse in response to said link pulse generated by said portable testing device, driving a first display device to indicate acceptable link status;

sensing whether said link pulse generated and transmitted to said portable testing device by said repeater of said network hub has a predetermined polarity, and, if so, driving a second display device to indicate said predetermined polarity has been sensed; and sensing whether said repeater of said network hub transmits a data packet in response to said link pulse generated by said portable testing device and coupled to said repeater of said network hub, and, if so, driving a third display device to indicate a data packet is being received.

* * * * *